US006426613B1

(12) United States Patent
Kadanka

(10) Patent No.: US 6,426,613 B1
(45) Date of Patent: Jul. 30, 2002

(54) REDUCED DROP OUT DRIVER AND METHOD OF USING

(75) Inventor: Petr Kadanka, Valasska Bystrice (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/848,197

(22) Filed: May 4, 2001

(51) Int. Cl.[7] .............................. G05F 3/16; H03L 5/00

(52) U.S. Cl. ....................................... 323/315; 327/333

(58) Field of Search ................................ 323/315, 314, 323/313, 312, 311, 273, 282, 280; 327/172, 288, 231, 333; 326/88

(56) References Cited

U.S. PATENT DOCUMENTS 4,071,783 A * 1/1978 Knepper ...................... 326/88
4,613,809 A * 9/1986 Skovmand .................. 323/268
5,162,668 A * 11/1992 Chen et al. .............. 307/296.8
5,686,821 A * 11/1997 Brokaw ...................... 323/273

* cited by examiner

*Primary Examiner*—Rajnikant B. Patel

(57) ABSTRACT

A driver circuit (30) is implemented within voltage regulator (10) to achieve improved dynamic performance of voltage regulator (10) while reducing the quiescent current required by driver (30). Depletion mode transistor (42) provides sufficient charge capability to the gate of transistor (34) and enhanced mode transistor (40) provides sufficient discharge capability to the gate of transistor (34). The charge and discharge capabilities of transistors (42 and 40) enables the feedback signal at node (32) to track the input voltage at terminal (IN) more effectively. Since transistor (40) is non-conductive at steady state, the quiescent current requirement of driver (30) at steady state is determined by current source (44).

7 Claims, 2 Drawing Sheets

REDUCED DROP OUT DRIVER AND METHOD OF USING

BACKGROUND OF THE INVENTION

The present invention relates in general to low drop out drivers and, more particularly, to low drop out drivers requiring low quiescent current with improved dynamic performance.

Most, if not all, electronic devices require some sort of power supply in order to operate. Additionally, many of the electronic devices require a regulated, Direct Current (DC) power source. The DC power source is generally derived, for example, from an Alternating Current (AC) source using a rectification circuit or from a DC power supply, such as a battery. In either case, a linear regulator is often used to supply the regulated output potential to the electronic device, using a P-Type Metal Oxide Semiconductor Field Effect Transistor (PMOSFET) to control current through a resistive ladder to ultimately provide the regulated output voltage. The driver is useful to provide high input and low output impedance which is used to isolate the regulation circuit from loading effects caused by the electronic circuit deriving power from the regulation circuit.

Some prior art drivers utilize an N-Type Metal Oxide Semiconductor Field Effect Transistor (NMOSFET) source follower in series with a constant current source to provide the gate drive voltage to the PMOS power transistor from the source terminal of the NMOSFET. The NMOSFET source follower driver provides adequate current drive to charge the gate of the PMOS power transistor, but the constant current source does not provide adequate discharging capability to turn the PMOS power transistor off in a short amount of time. Another prior art solution is to provide a constant current source in series with the NMOSFET such that the current source provides the charging current to the PMOS power transistor and the NMOSFET provides the discharging current, in which case, a slow charging current is produced with a fast discharging current. In addition, prior art drivers do not produce output voltages close enough to the top and bottom supply rails and therefore deliver poor drop out performance.

Hence, there is a need for a driver circuit which provides adequate dynamic performance in combination with low drop out operation.

DETAILED DESCRIPTION OF THE DRAWINGS

Figure 1:
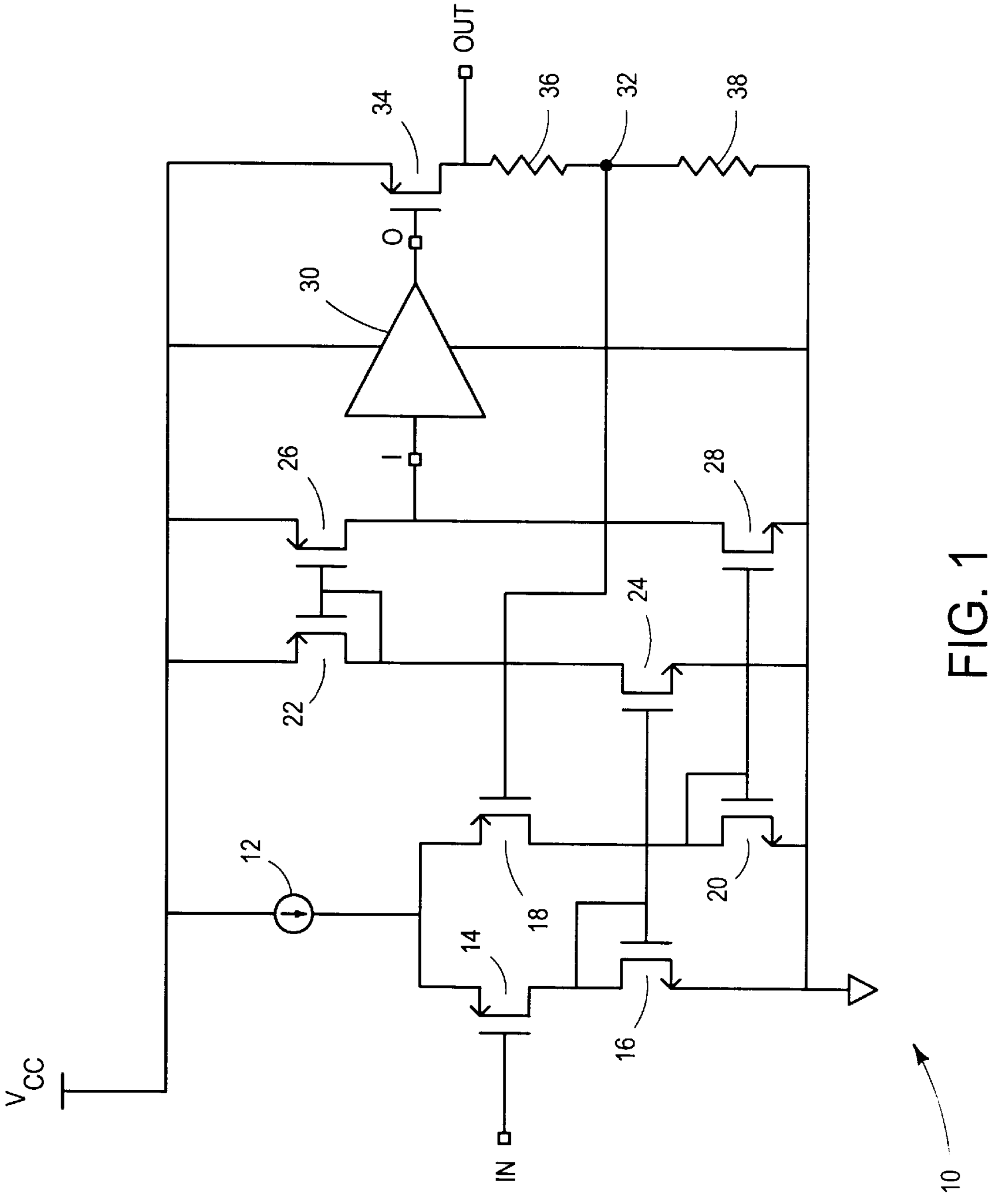
FIG. 1 is a schematic diagram illustrating a driver in combination with a linear regulator.

In FIG. 1, a schematic diagram of linear regulator 10, operated in conjunction with driver 30. Driver 30 provides a high impedance at terminal I and a low impedance at terminal O, to maintain the high gain of driver 30 and to reduce the capacitive effects of the gate of PMOS transistor 34.

PMOS transistors 14 and 18 are coupled to the top rail power supply terminal via current source 12. The drain terminal of transistor 14 is coupled to the drain and gate terminals of transistor 16. The source terminal of transistor 16 is coupled to the bottom rail power supply terminal, for example, ground potential. The drain terminal of transistor 18 is coupled to the drain and gate terminals of transistor 20. The source terminal of transistor 20 is coupled to the bottom rail power supply terminal. The gate terminal of transistor 16 is coupled to the gate terminal of transistor 24. The source terminal of transistor 24 is coupled to the bottom rail power supply terminal. The drain terminal of transistor 24 is coupled to the drain and gate terminals of transistor 22 and to the gate terminal of transistor 26. The source terminals of transistors 22 and 26 are coupled to the top rail power supply terminal. The drain terminal of transistor 26 is coupled to terminal IN of driver 30 and to the drain terminal of transistor 28. The source terminal of transistor 28 is coupled to the bottom rail power supply terminal. Driver 30 receives operational power from both the top and bottom rail power supply terminals. The output of driver 30 is supplied to the gate terminal of transistor 34 at terminal O. The source terminal of transistor 34 is coupled to the top rail power supply terminal and the drain of transistor 34 is coupled to a first conductor of resistor 36 at terminal OUT. A second conductor of resistor 36 and a first conductor of resistor 38 are coupled together at the gate terminal of transistor 18 to form a feedback path. The second conductor of transistor 38 is coupled to the bottom rail power supply terminal.

In operation, PMOS transistor 14 receives the input voltage at terminal IN. Current supplied by current source 12 is conducted by transistors 14 and 18 in equal amounts under regulated, steady state conditions. The current conducted by transistor 14 is mirrored by the operation of transistors 16 and 24. In other words, transistor 24 conducts an amount of current substantially equal to the current conducted by transistor 14, due to the operation of the current mirror formed by transistors 16 and 24. Transistor 26, likewise, conducts an amount of current equal to the current conducted by transistor 24, due to the current mirror operation of transistors 22 and 26. It can be seen, therefore, that transistor 26 conducts an amount of current equal to transistor 14 under regulated, steady state conditions. Similarly, current conducted by transistor 18 is mirrored by the operation of transistors 20 and 28. A voltage is created at terminal I by the drain terminals of transistors 26 and 28. An output voltage of driver 30, in response to the input voltage at terminal I, develops at terminal O to drive the gate terminal of transistor 34. Since transistor 34 is a PMOS device, a lower voltage at the gate terminal of transistor 34 causes transistor 34 to conduct a higher amount of current and a higher voltage at the gate terminal of transistor 34 causes transistor 34 to conduct a lower amount of current. The voltage developed across resistor 38 is substantially proportional to the amount of current conducted by transistor 34.

An increase in voltage at the gate terminal of transistor 14 causes a decrease in the amount of current conducted by transistors 24 and 26, as discussed earlier. A decrease in the amount of current conducted by transistor 26 causes a lower potential to exist at terminal I. The output of driver 30 is lower in proportion to the voltage at the input terminal I. A lower voltage at terminal O causes an increase in current conducted by transistor 34, which induces a larger voltage across resistor 38. Increasing the voltage across resistor 38 creates a lower current to be conducted by transistor 18, such that the feedback creates a voltage at the gate terminal of transistor 18 substantially equal to the gate voltage of transistor 14. It can be seen, therefore, that the speed of operation of voltage regulator 10 is directly proportional to the ability of driver 30 to charge and discharge the capacitive gate terminal of transistor 34.

Figure 2:
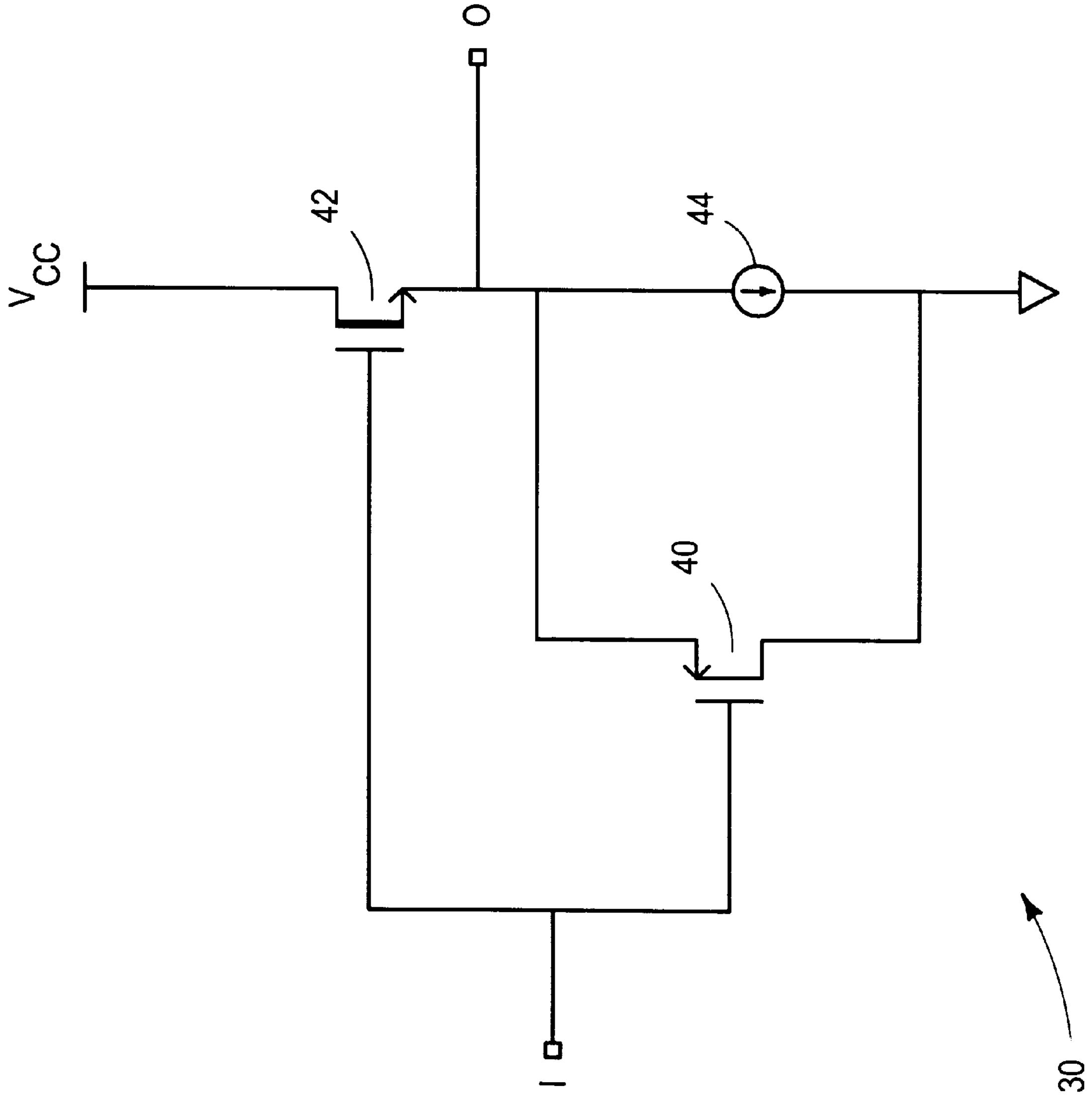
FIG. 2 is a schematic diagram illustrating the driver of FIG. 1.

Turning to FIG. 2, a schematic diagram of driver 30 is illustrated. The gate terminal of depletion mode, NMOS transistor 42 receives an input signal at terminal I. The gate terminal of enhanced mode, PMOS transistor 40 receives the input signal at terminal I. The source terminals of transistors 42 and 40 are coupled together to a first terminal of current source 44 at terminal O. A second terminal of current source 44 is coupled to the bottom supply rail, for example, ground potential. The drain terminal of transistor 42 is coupled to the top power supply rail, $V_{cc}$.

In operation, driver 30 receives an input voltage at terminal I and produces an output voltage at terminal O in relation to the input voltage at terminal I. Transistor 42 is a depletion mode transistor, such that the source voltage of transistor 42 is allowed to increase to a voltage greater than the voltage present at the gate terminal of transistor 42. Since the source voltage of transistor 42 is allowed to increase above the gate voltage of transistor 42, the voltage at terminal O is allowed to be substantially equal to the top rail supply voltage $V_{cc}$, minus the saturation voltage of transistor 42. The threshold voltage of transistor 40 is greater than the threshold voltage of transistor 42 and therefore remains non-conductive throughout most of the dynamic range of driver 30. Once the voltage at terminal I has decreased below the threshold voltage of transistor 40, transistor 40 is rendered conductive and sinks available current at terminal O. Current available at terminal O, for example, is the discharging current from the capacitive gate terminal of PMOS transistor 34, when the output voltage of regulator 10 transitions to ground potential. Transistor 40, therefore, provides the current sink capability required to quickly discharge the gate terminal of PMOS transistor 34. Transistor 42, conversely, provides the current source capability required to charge the gate capacitance of PMOS transistor 34.

A first advantage of the driver circuit of FIG. 2 is the dynamic performance of transistors 40 and 42 required to achieve fast reaction times of the feedback signal provided at node 32. As discussed earlier, the feedback signal present at node 32 endeavors to create a potential at the gate terminal of transistor 18, substantially equal to the gate potential of transistor 14. During an enable sequence of voltage regulator 10, for example, the voltage at terminal IN increases from a voltage of 0.2 volts, for example, to the required input voltage, 1.5 volts for example, at terminal IN. The amount of current conducted by transistor 14 decreases, causing the amount of current conducted by transistor 16 to decrease. A decrease in the amount of current conducted by transistor 16 is mirrored by a decrease in the amount of current conducted by transistor 24. A decrease in the amount of current conducted by transistor 24, induces a decrease in the amount of current conducted by transistor 22 and also causes a decrease in the amount of current conducted by transistor 26. A decrease in the amount of current conducted by transistor 26 causes a decrease in the voltage at terminal I. Provided that the voltage at terminal I decreases below the threshold voltage of transistor 40, transistor 40 transitions to a conductive state. Once transistor 40 becomes conductive, the source terminal of transistor 40 achieves a potential substantially equal to the bottom rail power supply terminal, for example, ground potential plus the gate to source voltage of transistor 40. The ability of transistor 40 to conduct, or discharge, the charge existing on the gate terminal of transistor 34, allows driver 30 to quickly render transistor 34 conductive. As current flows through transistor 34, a voltage develops across resistors 36 and 38, which sets the feedback voltage at node 32 equal to the level of voltage present at terminal IN. The speed at which voltage regulator 10 achieves steady state output voltage at terminal OUT is therefore directly proportional to the discharging capability of transistor 40.

A second advantage of driver 30 is shown by the low quiescent current requirements of driver 30. The steady state quiescent current required by driver 30 is given only by the current conducted by current source 44. At steady state, transistor 40 is non-conductive and transistor 42 conducts a quiescent current substantially equal to the amount of current provided by current source 44. As described above, transistor 40 becomes conductive during a decrease in voltage at terminal I, sufficiently below the threshold voltage of transistor 40 and serves only to discharge the gate charge of transistor 34.

In summary, a low quiescent current voltage regulator is presented which provides improved dynamic performance. Charging and discharging transistors are provided by driver 30 to effectively charge and discharge the gate charge of transistor 34, which increases the speed at which the feedback voltage at node 32 equalizes the voltage at the gate terminal of transistor 18 to the voltage at the gate terminal of transistor 14. In addition, quiescent current is reduced since transistor 40 is rendered non-conductive at steady state, causing the steady state quiescent current required by driver 30 to be substantially equal to current source 44.

What is claimed is:

1. In a voltage regulation circuit, a driver circuit providing a drive signal in response to a feedback signal, the driver circuit comprising:

a depletion mode transistor having a control terminal coupled to receive a control signal in response to the feedback signal and having a first conductor coupled to provide a charging signal at a first node; and a p-channel transistor having a control terminal coupled to receive the control signal and having a first conductor coupled to provide a discharging signal at the first node.

2. The driver circuit of claim 1 wherein the depletion mode transistor has a first conductor coupled to a first power supply conductor, a second conductor coupled to the first node and a control terminal coupled to receive the control signal.

3. The driver circuit of claim 2 wherein the depletion mode transistor includes an n-type field effect transistor.

4. A driver circuit, comprising:

a depletion mode transistor having a control input coupled to receive a control signal, a first conductor coupled to receive a first supply potential and a second conductor coupled to provide a charging signal at an output node for all values of the control signal; and a p-channel enhanced mode transistor having a control input coupled to receive the control signal, a first conductor coupled to receive a second supply potential and a second conductor coupled to provide a discharging signal at the output node for values of the control signal below a predetermined threshold value.

5. The driver circuit of claim 4 wherein the depletion mode transistor includes an n-type field effect transistor.

6. A method of providing a drive signal to operate a voltage regulator between first and second output levels, comprising:

driving a depletion mode transistor with a feedback signal to produce a charging signal; and turning on a p-channel enhanced mode transistor with the feedback signal to produce a discharging signal.

7. The method of claim 6 wherein the step of turning on comprises:

maintaining a non-conductive state of the p-channel enhanced mode transistor for values of the feedback signal below a predetermined threshold; and establishing a conductive state of the enhanced mode transistor for values of the feedback signal above the predetermined threshold.

* * * * *